(12) United States Patent
Kobayashi et al.

(10) Patent No.: US 9,419,042 B2
(45) Date of Patent: Aug. 16, 2016

(54) SOLID-STATE IMAGING APPARATUS AND ELECTRONIC DEVICE

(71) Applicant: Sony Corporation, Tokyo (JP)

(72) Inventors: Mikiko Kobayashi, Kanagawa (JP); Kazuyoshi Yamashita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/050,165

(22) Filed: Feb. 22, 2016

(65) Prior Publication Data
US 2016/0172409 A1    Jun. 16, 2016

Related U.S. Application Data

(63) Continuation of application No. 14/830,405, filed on Aug. 19, 2015, which is a continuation of application No. 13/852,575, filed on Mar. 28, 2013, now Pat. No. 9,184,208.

(30) Foreign Application Priority Data

Apr. 4, 2012  (JP) ................................ 2012-085666

(51) Int. Cl.
   *H01L 27/146* (2006.01)
(52) U.S. Cl.
   CPC .... *H01L 27/14641* (2013.01); *H01L 27/14612* (2013.01); *H01L 27/14636* (2013.01); *H01L 27/14643* (2013.01)
(58) Field of Classification Search
   CPC ................... H01L 27/14641; H01L 27/14612; H01L 27/14636; H01L 27/14643; H01L 27/14812; H01L 27/14605; H01L 27/14609

USPC ................................ 250/208.1; 257/290–292
See application file for complete search history.

(56) References Cited

U.S. PATENT DOCUMENTS

2012/0056252 A1*  3/2012 Aoki ................... G09G 3/3648
                                                         257/292

FOREIGN PATENT DOCUMENTS

| JP | H04-212454 | 8/1992 |
| JP | 2758504 | 5/1998 |
| JP | 2001-230400 | 8/2001 |
| JP | 2007-042801 | 2/2007 |
| JP | 2010-212288 | 9/2010 |
| JP | 2010-273095 | 12/2010 |

OTHER PUBLICATIONS

Official Action (no English translation available) for Japanese Patent Application No. 2012-085666 mailed Feb. 2, 2016, 5 pages.

* cited by examiner

*Primary Examiner* — Seung C Sohn
(74) *Attorney, Agent, or Firm* — Sheridan Ross P.C.

(57) ABSTRACT

Disclosed herein is a solid-state imaging apparatus including: a semiconductor base; a photodiode created on the semiconductor base and used for carrying out photoelectric conversion; a pixel section provided with pixels each having the photodiode; a first wire created by being electrically connected to the semiconductor base for the pixel section through a contact section and being extended in a first direction to the outside of the pixel section; a second wire made from a wiring layer different from the first wire and created by being extended in a second direction different from the first direction to the outside of the pixel section; and a contact section for electrically connecting the first and second wires to each other.

20 Claims, 11 Drawing Sheets

F I G . 3
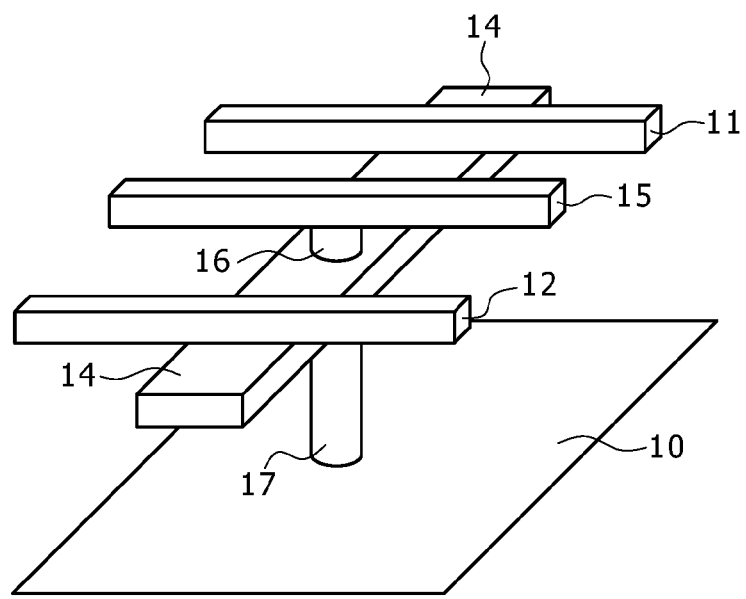
F I G . 4
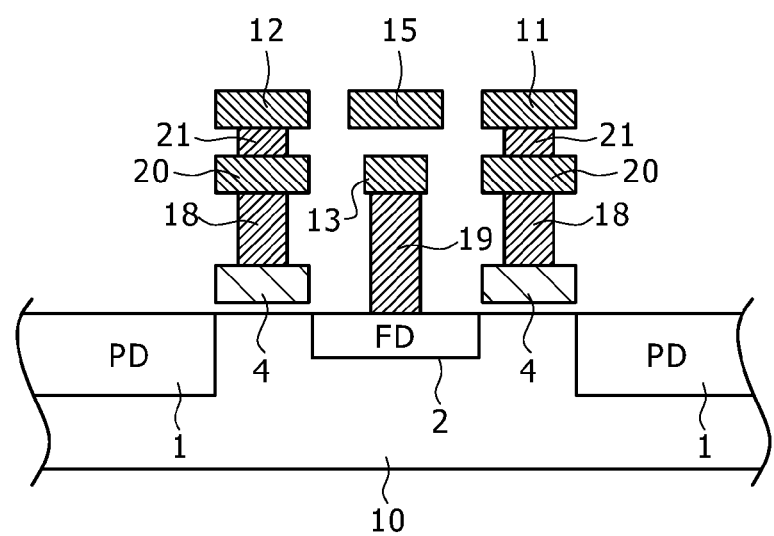

SOLID-STATE IMAGING APPARATUS AND ELECTRONIC DEVICE

CROSS-REFERENCE TO RELATED APPLICATIONS

This application is a continuation of U.S. patent application Ser. No. 14/830,405, filed Aug. 19, 2015, which claims priority to U.S. patent application Ser. No. 13/852,575, filed Mar. 28, 2013, now U.S. Pat. No. 9,184,208, which claims priority to Japanese Patent Application No. JP 2012-085666, filed in the Japan Patent Office on Apr. 4, 2012, the entire disclosures of which are hereby incorporated herein by reference.

BACKGROUND

The present technology relates to a solid-state imaging apparatus and an electronic device employing the apparatus.

In a CMOS (complementary metal-oxide semiconductor) solid-state imaging apparatus, a wire for supplying a voltage to pixels is created in a first wiring layer extended in a vertical or horizontal direction. For more information, refer to documents such as Japanese Patent Laid-open No. 2004-104203.

FIG. 13 is a diagram roughly showing a typical top view of a CMOS solid-state imaging apparatus having a configuration of related art.

As shown in FIG. 13, each pixel includes a photodiode (PD) 51, a floating diffusion (FD) 52 and a transistor (TR) section 53. A number of such pixels are laid out in the vertical and horizontal directions to form a configuration. The transistor section 53 includes an amplify transistor, a select transistor and a reset transistor.

Between the photodiode 51 and the floating diffusion 52, a read gate 54 is provided. A wire 61 is created on the read gate 54.

The floating diffusion 52 and the transistor section 53 are connected to each other by a wire 63 provided on the left side of the photodiode 51. On the left side of the wire 63, a ground wire 64 extended in the vertical direction is provided. The ground wire 64 is connected to a semiconductor base by a contact section 65.

The ground wire 64 receives a ground electric potential also referred to as an earth electric potential from an external source so that the electric potential appearing on the semiconductor base is fixed at the earth electric potential.

The wires 61 and 63 as well as the ground wire 64 are each created as a first wiring layer which is a metallic-wiring layer. The first wiring layer is connected to a second wiring layer, which is also a metallic-wiring layer, through a contact section. However, the connection of the first wiring layer to the second wiring layer is not shown in the figure.

SUMMARY

In the configuration shown in FIG. 13, the ground wire 64 is stretched in the vertical direction. In a configuration including a ground wire stretched in the horizontal direction and a configuration including a ground wire stretched in the vertical direction as is the case with the configuration shown in the figure, when a portion of the ground wire is inadvertently broken, the configuration will undesirably include a pixel row and/or a pixel column in which the electric potentials of the semiconductor bases are not fixed at the earth electric potential.

Thus, a vertical or horizontal line may be generated on an image in some cases. In addition, a shading or the like may be generated on the screen in some cases due to a weakened state in which the semiconductor base is fixed at the earth electric potential. When these phenomena occur, the phenomena become causes of a deteriorating image quality and a reduced yield.

It is thus desired to provide a solid-state imaging apparatus having a configuration capable of improving the image quality and increasing the yield. It is also desired to provide an electronic device employing the solid-state imaging apparatus.

A solid-state imaging apparatus according to an embodiment of the present technology includes: a semiconductor base; a photodiode created on the semiconductor base and used for carrying out photoelectric conversion; and a pixel section provided with pixels each having the photodiode.

In addition, the solid-state imaging apparatus also includes a first wire created by being electrically connected to the semiconductor base for the pixel section through a contact section and being extended in a first direction to the outside of the pixel section.

On top of that, the solid-state imaging apparatus also includes a second wire made from a wiring layer different from the first wire and created by being extended in a second direction different from the first direction to the outside of the pixel section.

The solid-state imaging apparatus further includes a contact section for electrically connecting the first and second wires to each other.

An electronic device according to another embodiment of the present technology includes an optical system, the solid-state imaging apparatus described above and a signal processing circuit for processing signals output by the solid-state imaging apparatus.

As described above, the configuration of the solid-state imaging apparatus according to the embodiment of the present technology includes: a first wire created by being extended in a first direction to the outside of the pixel section and being electrically connected to a semiconductor base by a contact section; and a second wire created by being extended in a second direction different from the first direction to the outside of the pixel section and being electrically connected to the first wire by the contact section.

Thus, even if either the first wire or the second wire is broken, it is possible to provide an electric potential to the semiconductor base through the other one of the first wire and the second wire.

In addition, since the first and second wires are electrically connected to each other, the resistance of these wires for supplying an electric potential to the semiconductor base is reduced.

As described above, the configuration of the electronic device according to the embodiment of the present technology includes the solid-state imaging apparatus according to the embodiment of the present technology. Thus, even if either the first or second wire of the solid-state imaging apparatus is broken, it is possible to provide an electric potential to the semiconductor base through the other one of the first wire and the second wire. In addition, since the first and second wires are electrically connected to each other, the resistance of these wires for supplying an electric potential to the semiconductor base can be reduced.

As described above, in accordance with the embodiments of the present technology, there is provided a configuration including: a first wire created by being extended in a first direction to the outside of the pixel section and being electrically connected to a semiconductor base by a contact section; and a second wire made from a wiring layer different from the first wire and created by being extended in a second direction different from the first direction to the outside of the pixel section and being electrically connected to the first wire by the contact section.

Thus, even if either the first wire or the second wire is broken, it is possible to provide an electric potential to the semiconductor base through the other one of the first wire and the second wire.

As a result, the electric potential of the semiconductor base can be sustained at a fixed level so that it is possible to improve the image quality and increase the yield.

In addition, in accordance with the embodiments of the present technology, the resistance of these wires for supplying an electric potential to the semiconductor base can be reduced. It is thus possible to strengthen the electric potential of the semiconductor base. Therefore, it is possible to eliminate characteristic variations from pixel to pixel on the screen and get rid of shadings of the screen so as to improve the image quality and increase the yield.

BRIEF DESCRIPTION OF THE DRAWINGS

FIG. 3 is a diagram showing a perspective (overhead) view of portions connecting the first and second ground wires to each other;

FIG. 4 is a diagram showing a cross section of the vicinity of a floating diffusion in the solid-state imaging apparatus according to the first embodiment;

FIG. 14A is a diagram showing waveforms of rectangular input pulses whereas

DETAILED DESCRIPTION OF THE PREFERRED EMBODIMENTS

Preferred embodiments of the present technology are described below. It is to be noted that the description is divided into the following topics:
1. First Embodiment (Solid-State Imaging Apparatus)
2. Second Embodiment (Solid-State Imaging Apparatus)
3. Third Embodiment (Solid-State Imaging Apparatus)
4. Fourth Embodiment (Electronic Device)

1. First Embodiment

Figure 1:
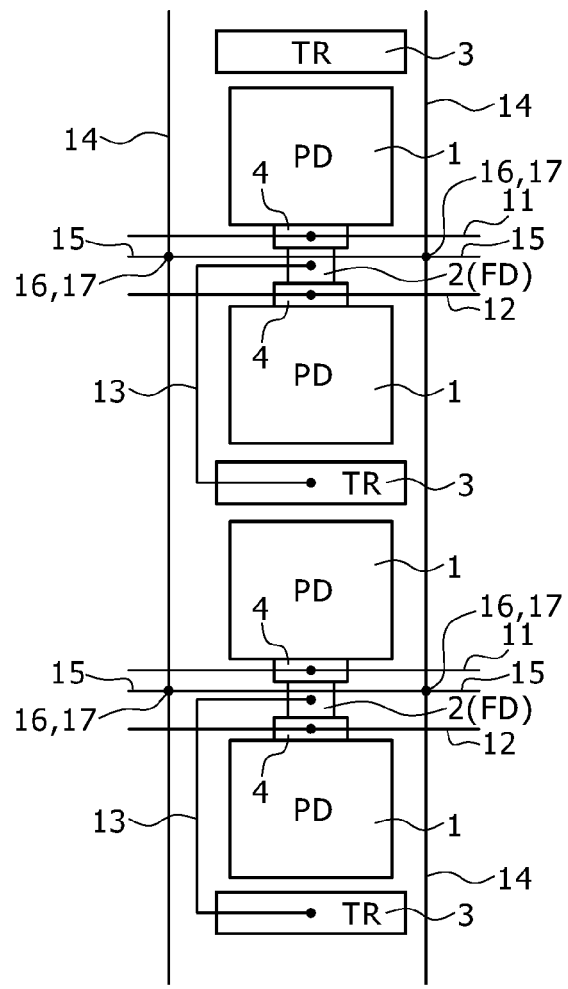
FIG. 1 is a diagram showing a rough configuration of a solid-state imaging apparatus according to a first embodiment or a diagram showing a circuit configuration of main components employed in the solid-state imaging apparatus.

FIG. 1 is a diagram showing a rough configuration of a solid-state imaging apparatus according to a first embodiment or a diagram showing a circuit configuration of main components employed in the solid-state imaging apparatus. FIG. 1 shows a circuit configuration of a vertical column of pixels included in a pixel section of the solid-state imaging apparatus. The embodiment applies the present technology to a CMOS solid-state imaging apparatus.

As shown in FIG. 1, the solid-state imaging apparatus according to the first embodiment is configured to include pixels each including a photodiode (PD) 1, a floating diffusion (FD) 2 and a transistor (TR) section 3 having pixel transistors which are each a MOS transistor.

The photodiode 1 is created in a semiconductor base made of a semiconductor material such as silicon. The photodiode 1 serves as a photoelectric conversion section for carrying out a photoelectric conversion process of converting incident light into electric charge.

A typical semiconductor base has any one of configurations including a semiconductor substrate single body, a semiconductor substrate with an epitaxial layer created thereon and a semiconductor layer created on another substrate.

The floating diffusion 2 is typically an N-type impurity area created in a semiconductor base. The floating diffusion 2 serves as an electric-charge accumulating section for accumulating electric charge obtained as a result of the photoelectric conversion process carried out by the photodiode 1.

A transfer gate 4 is provided between the photodiode 1 and the floating diffusion 2. The transfer gate 4 is gate for transferring electric charge obtained as a result of the photoelectric conversion process carried out by the photodiode 1 to the floating diffusion 2.

The transistor section 3 typically includes at least one of pixel transistors such as a reset transistor, an amplify transistor and a select transistor.

In this embodiment, two adjacent pixels each having a photodiode 1 share a floating diffusion 2 and a transistor section 3 which are common to the photodiodes 1. Let the two adjacent pixels be referred to hereafter as upper-side and lower-side pixels respectively.

The floating diffusion 2 is provided between the two photodiodes 1 included in the upper-side and lower-side pixels respectively.

The transistor section 3 is provided on the lower side of the photodiodes 1 included in the upper-side and lower-side pixels respectively and electrically connected to the floating diffusion 2 by a wire 13.

The transfer gate 4 of the upper-side pixel of the two adjacent pixels is connected to a first control line 11 whereas the transfer gate 4 of the lower-side pixel of the two adjacent pixels is connected to a second control line 12.

Figure 13:
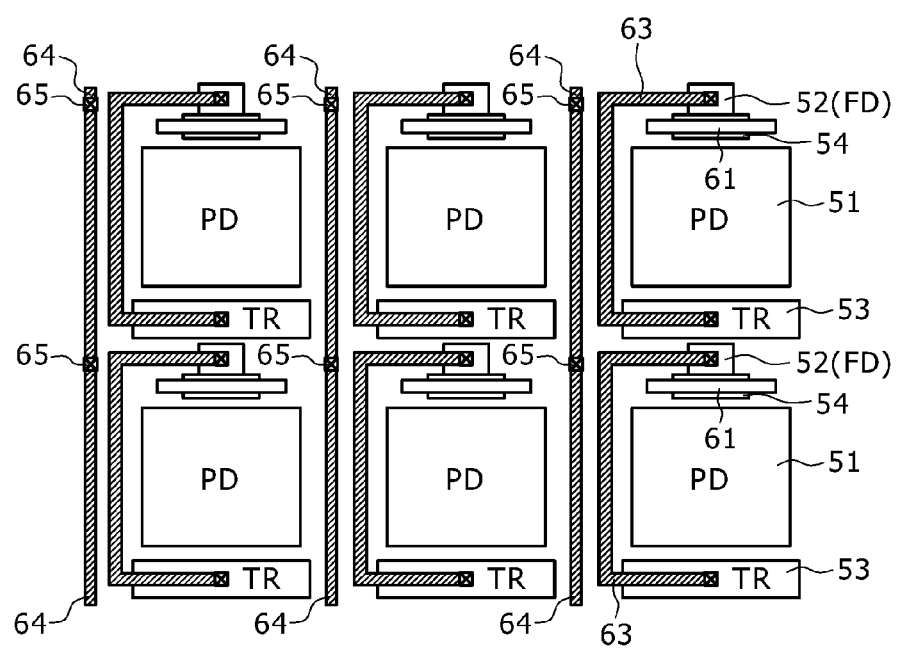
FIG. 13 is a diagram roughly showing a typical top view of a CMOS solid-state imaging apparatus having a configuration of related art.

In the same way as the ground wire 64 of the configuration of related art shown in FIG. 13, a first ground wire 14 is provided and stretched in the vertical direction in FIG. 1.

In this embodiment, a second ground wire 15 is further provided and stretched in the horizontal direction in FIG. 1. The second ground wire 15 is electrically connected to the first ground wire 14 to form a ground line.

A ground electric potential also referred to hereafter as an earth electric potential is supplied to the first ground wire 14 and the second ground wire 15.

Figure 2A:
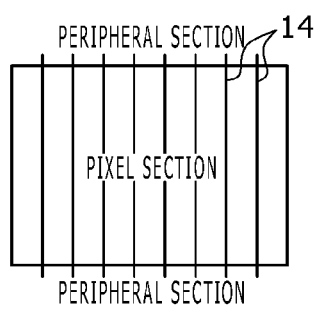
FIGS. 2A and 2B are diagrams showing top views of layouts of respectively first and second ground wires shown in FIG. 1.
Figure 2B:
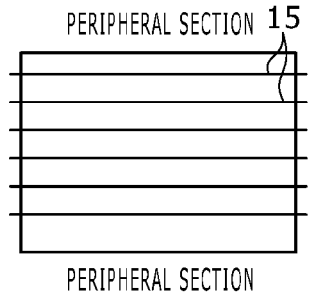

FIGS. 2A and 2B are diagrams showing top views of layouts of respectively the first ground wire 14 and the second ground wire 15 which are shown in FIG. 1. To be more specific, FIG. 2A shows the layout of the first ground wires 14 whereas FIG. 2B shows the layout of the second ground wires 15.

As shown in FIG. 2A, the first ground wires 14 are stretched in the vertical direction from a pixel section to upper and lower peripheral sections outside the pixel section and connected to the peripheral sections.

As shown in FIG. 2B, on the other hand, the second ground wires 15 are stretched in the horizontal direction from the pixel section to left and right peripheral sections outside the pixel section and connected to the peripheral sections.

Since the first ground wires 14 and the second ground wires 15 are configured as described above, when seen from a location above the first ground wires 14 and the second ground wires 15, the first ground wires 14 and the second ground wires 15 appear as wires stretched to form a mesh.

In addition, as described above, a ground electric potential also referred to as an earth electric potential is supplied to the first ground wires 14 and the second ground wires 15 from a source external to the pixel section.

It is to be noted that the peripheral sections shown in FIGS. 2A and 2B have circuits including a signal processing circuit for processing an electrical signal coming from the pixel section. The first ground wires 14 and the second ground wires 15 are connected to the circuits in the peripheral sections.

In addition, FIG. 3 is a diagram showing a perspective (overhead) view of portions connecting the first and second ground wires to each other.

As shown in FIGS. 1 and 3, the second ground wire 15 is created in the same layer as the first control line 11 and the second control line 12 and provided between the first control line 11 and the second control line 12.

The first ground wire 14 is created as a first wiring layer which is a metallic wiring layer serving as a lower layer. On the other hand, the second ground wire 15 is created as a second wiring layer different from the first wiring layer. The second wiring layer is a metallic wiring layer serving as an upper layer.

The first ground wire 14 is electrically connected to a semiconductor base 10 by a contact section 17 making use of a via layer provided in an insulation layer and made of a semiconductor material.

The first ground wire 14 is electrically connected to the second ground wire 15 by a contact section 16 making use of a via layer provided in an insulation layer and made of a semiconductor material.

In addition, FIG. 4 is a diagram showing a cross section of the vicinity of the floating diffusion 2 in the solid-state imaging apparatus according to the first embodiment.

To be more specific, FIG. 4 is a cross-sectional diagram showing two adjacent pixels sharing the floating diffusion 2 and portions existing between the pixels.

As shown in FIG. 4, a contact section 18, a wiring layer 20 and a contact section 21 are created sequentially in the upward direction starting from a lower layer between the transfer gate 4 and the first control line 11. The contact section 18, the wiring layer 20 and the contact section 21 connect the transfer gate 4 and the first control line 11 to each other. By the same token, a contact section 18, a wiring layer 20 and a contact section 21 are created sequentially in the upward direction starting from a lower layer between the transfer gate 4 and the second control line 12. The contact section 18, the wiring layer 20 and the contact section 21 connect the transfer gate 4 and the second control line 12 to each other. Each of the contact section 18 and the contact section 21 makes use of a via layer.

In addition, the floating diffusion 2 is connected to the wire 13 shown in FIG. 1 through a contact section 19 making use of a via layer.

The second ground wire 15 is provided above the wire 13, being insulated from the wire 13.

In the same way as the first ground wire 14, each of the wiring layer 20 and the wire 13 is created from the first wiring layer which is a metallic wiring layer.

It is to be noted that the cross-sectional diagram of FIG. 4 does not show a configuration above the first control line 11, the second control line 12 and the second ground wire 15.

Since the second ground wire 15 is provided between the first control line 11 and the second control line 12, the second ground wire 15 also plays a role as a shield wire for preventing coupling between the first control line 11 and the second control line 12.

To put it in detail, in order to turn on and off the transfer gate 4, a pulse voltage is supplied to each of the first control line 11 and the second control line 12. If the first control line 11 and the second control line 12 are provided at locations adjacent to each other, coupling may occur between the first control line 11 and the second control line 12 in some cases.

Since a ground electric potential also referred to as an earth electric potential is supplied to the second ground wire 15 to serve as a fixed electric potential, however, the second ground wire 15 also plays a role as a shield wire for preventing coupling between the first control line 11 and the second control line 12.

The following description explains an effect of improving the waveform of a pulse on the transfer gate 4 due to the prevention of the coupling between the first control line 11 and the second control line 12.

Figure 14A:
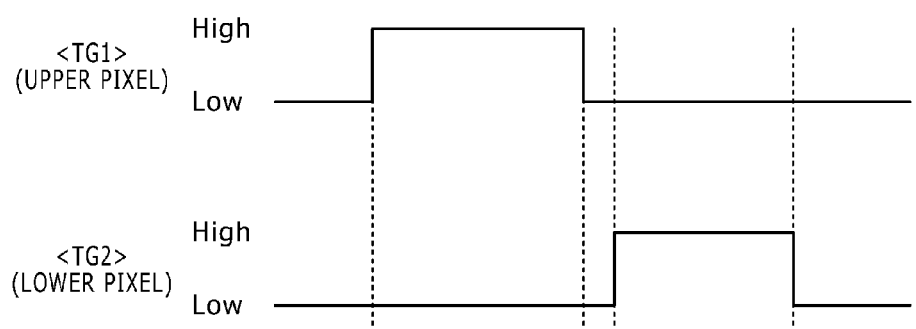

Consider a case in which rectangular input pulses shown in FIG. 14A are supplied sequentially to the transfer gates of two adjacent pixels sharing a floating diffusion. In the following description, the two adjacent pixels are also referred to as upper and lower pixels respectively.

As shown in FIG. 14A, first of all, the rectangular input pulse is supplied to the transfer gate TG1 of the upper pixel. Then, after the falling edge of the rectangular input pulse supplied to the transfer gate TG1 of the upper pixel, the other rectangular input pulse is supplied to the transfer gate TG2 of the lower pixel.

Figure 14B:
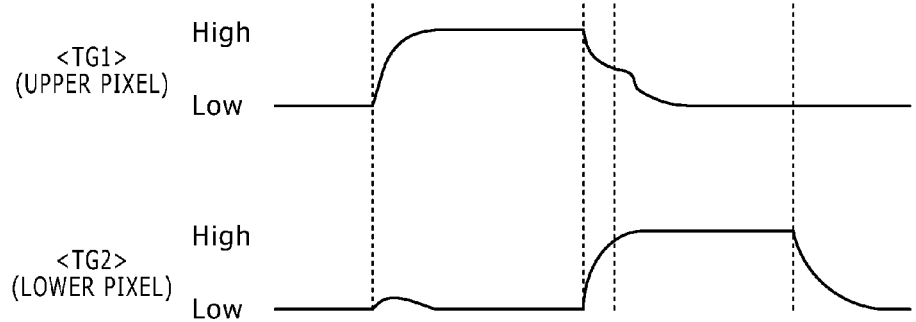
FIG. 14B is a diagram showing waveforms of actual pulses.

With the configuration of related art in which the ground wire is created as one layer, for a case in which two pixels share a floating diffusion, two control lines each used for supplying a voltage to the transfer gate of one of the pixels are stretched adjacently to each other. Thus, coupling may occur between these two control lines in some cases. When such coupling occurs, the waveforms of the actually obtained pulses are distorted as shown in FIG. 14B. To be more specific, the falling edge of the waveform for the upper pixel changes because the falling edge is affected by the rising edge of the rectangular pulse for the lower pixel. On the other hand, the electric potential of the lower pixel swings due to the effect of the rising edge of the rectangular pulse for the upper pixel.

As described above, when coupling occurs between the two control lines, the waveforms of the voltage pulses deteriorate. It is thus feared that driving cannot be carried out correctly. In addition, in order to decrease the effect of the coupling on the waveforms of the voltage pulses, it is necessary to increase the width of the voltage pulses and the gap between the voltage pulses. Thus, it is difficult to carry out the high-speed driving.

In the configuration according to this embodiment, on the other hand, the second ground wire 15 prevents the coupling between the first control line 11 and the second control line 12. That is to say, the second ground wire 15 functions as a shield wire. Thus, it is possible to substantially decrease changes of the actual-pulse waveforms from the input-pulse waveforms shown in FIG. 14A.

As a result, it is possible to obtain actual-pulse waveforms which are about identical with the input-pulse waveforms shown in FIG. 14A.

Next, by referring to top-view diagrams of FIGS. 5 to 9, the following description explains typical cubic structures of the solid-state imaging apparatus according to this embodiment.

Figure 5:
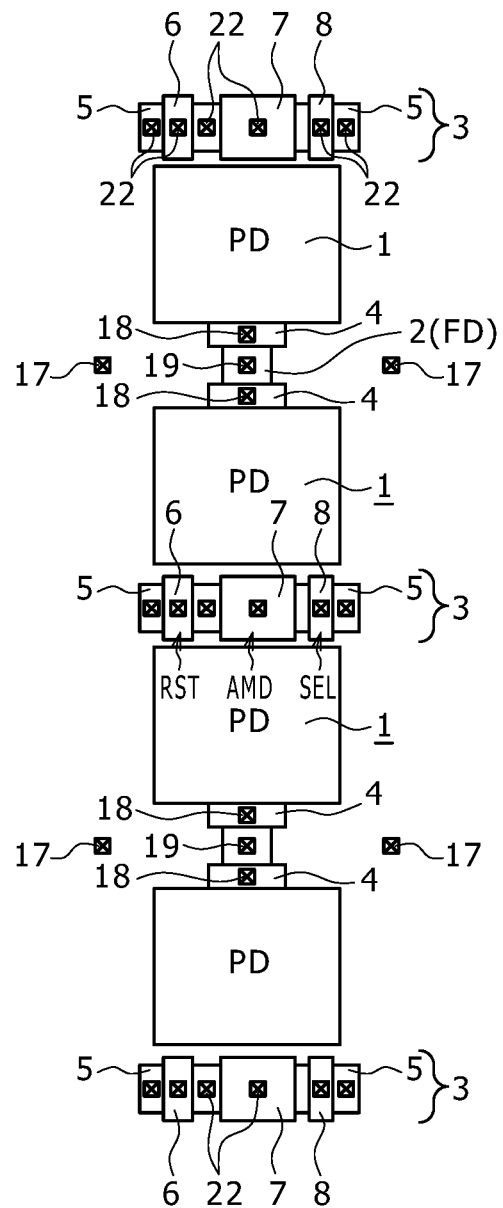
FIG. 5 is a diagram showing a top view of main components employed in the solid-state imaging apparatus according to the first embodiment.

FIG. 5 is a top-view diagram showing a semiconductor area of the semiconductor base 10, a poly-crystal silicon layer on the semiconductor base 10 and contact sections provided thereon. The semiconductor base 10 is shown in FIGS. 3 and 4.

The transfer gate 4 is created from the poly-crystal silicon layer. The contact section 18 shown in FIG. 4 is created on the transfer gate 4.

The contact section 19 shown in FIG. 4 is created on the floating diffusion 2.

The contact sections 17 shown in FIG. 3 are created on sides more external than the photodiodes 1 on the left and right sides of the floating diffusion 2. The contact section 17 connects the semiconductor base 10 and the first ground wire 14 to each other.

The transistor section 3 includes a reset transistor RST, an amplify transistor AMP and a select transistor SEL which are created and arranged in a direction from the left to the right.

The reset transistor RST is configured to include a reset gate electrode 6 and source/drain areas. The reset gate electrode 6 serving as the gate electrode of the reset transistor RST is made from a poly-crystal silicon layer whereas the source/drain area is made from an impurity area 5 in the semiconductor base 10.

By the same token, the amplify transistor AMP is configured to include an amplify gate electrode 7 and source/drain areas. The amplify gate electrode 7 serving as the gate electrode of the amplify transistor AMP is made from a poly-crystal silicon layer whereas the source/drain area is made from the impurity area 5 in the semiconductor base 10.

In the same way, the select transistor SEL is configured to include a select gate electrode 8 and source/drain areas. The select gate electrode 8 serving as the gate electrode of the select transistor SEL is made from a poly-crystal silicon layer whereas the source/drain area is made from the impurity area 5 in the semiconductor base 10.

The reset transistor RST and the amplify transistor AMP share one of the source/drain areas.

By the same token, the amplify transistor AMP and the select transistor SEL also share one of the source/drain areas. A contact section 22 connected to an upper-layer wire is created for the impurity areas 5 allocated to the source/drain areas other than the source/drain area shared by the amplify transistor AMP and the select transistor SEL and for the gate electrodes 6, 7 and 8.

Figure 6:
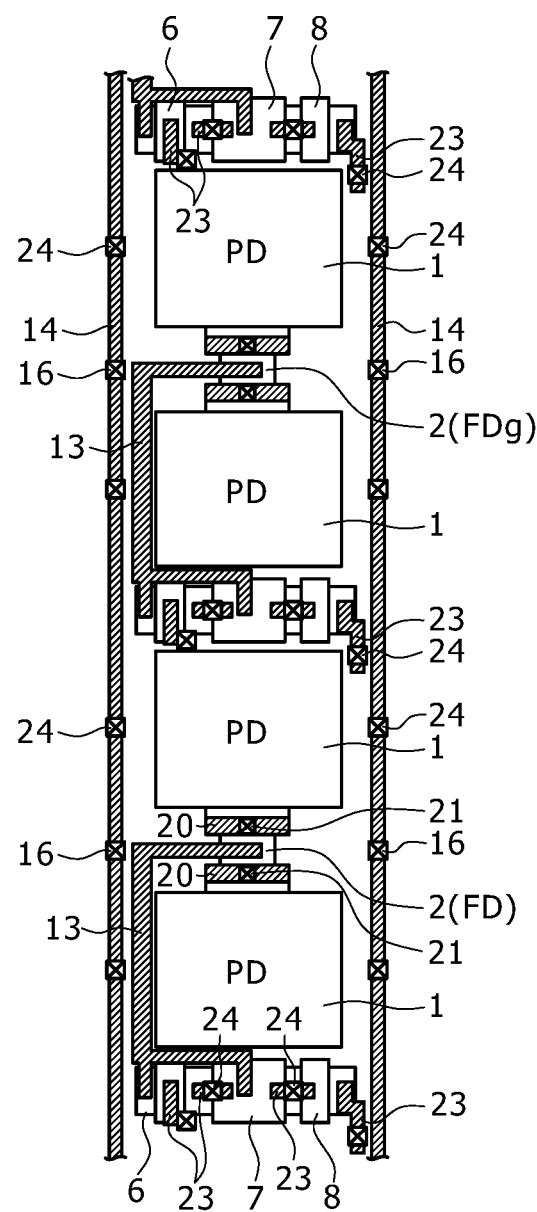
FIG. 6 is a diagram showing a top view of main components employed in the solid-state imaging apparatus according to the first embodiment.

FIG. 6 is a diagram showing a top view of a first wiring layer, which is a metallic wiring layer, and contact sections created on the layer. It is to be noted that FIG. 6 also shows the photodiodes 1 and the floating diffusions 2 in order to make positional relations with other figures easy to understand. In addition, each wire is hatched in order to make the wire distinguishable from other wires and other components.

On the left and right sides of the photodiode 1, the first ground wires 14 are created and stretched in the vertical direction. At the left and right positions of the floating diffusion 2 of the first ground wire 14, contact sections 16 to be connected to the second ground wires 15 are created. In addition, at the left and right positions of the center of the photodiode 1, contact sections 24 to be connected to the upper wiring layer are created.

The wire 13 of the floating diffusion 2 is extended to the transistor section 3 through the left side of the photodiode 1 and connected to the amplify gate electrode 7 in the transistor section 3 through the contact section 22 shown in FIG. 5. In addition, this wire 13 is also connected to the left-side source/drain area of the reset transistor RST of the transistor section 3 through the contact section 22 shown in FIG. 5.

The source/drain area shared by the reset transistor RST and the amplify transistor AMP is connected to a wiring layer 23 through the contact section 22 shown in FIG. 5. It is to be noted that the wiring layer 23 connected to the source/drain area shared by the reset transistor RST and the amplify transistor AMP is created to reach a location above the amplify gate electrode 7 on the right side. However, the wiring layer 23 is not connected to the amplify gate electrode 7.

The select gate electrode 8 is connected to another wiring layer 23 through the contact section 22 shown in FIG. 5. It is to be noted that the other wiring layer 23 connected to the select gate electrode 8 is created to reach a location above the amplify gate electrode 7 on the left side. However, the other wiring layer 23 is not connected to the amplify gate electrode 7 and the source/drain area shared with the amplify transistor AMP.

The reset gate electrode 6 is connected to a further wiring layer 23. By the same token, the right-side source/drain area of the select transistor SEL is connected to a still further wiring layer 23.

For each of the wiring layers 23, a contact section 24 for a connection to the upper wiring layer is created.

On the transfer gate 4, the wiring layer 20 shown in FIG. 4 and the contact section 21 on the wiring layer 20 are created. It is to be noted that, in the configuration shown in FIG. 6, the total of the left and right lengths of the wiring layer 20 is about equal to the length of the transfer gate 4. However, the wiring layer 20 may also be created to have a total length different from the length of the transfer gate 4. The wiring layer 20 is created and insulated from the first ground wire 14 and the wire 13.

Figure 7:
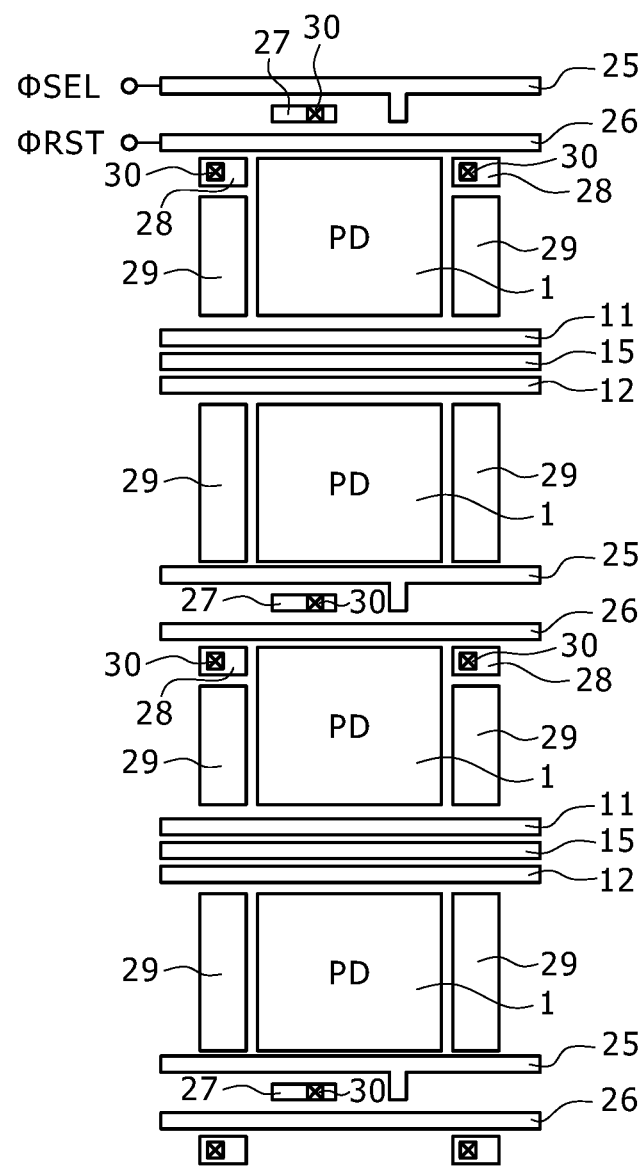
FIG. 7 is a diagram showing a top view of main components employed in the solid-state imaging apparatus according to the first embodiment.

FIG. 7 is a diagram showing a top view of a second wiring layer, which is a metallic wiring layer, and contact sections created on the layer. It is to be noted that FIG. 7 also shows the photodiodes 1 in order to make positional relations with other figures easy to understand.

The two adjacent pixels sharing a floating diffusion 2 include upper and lower pixels. On the left and right sides of the photodiode 1 of the upper pixel, a wiring layer 28 and a wiring layer 29 are created. On the left and right sides of the photodiode 1 of the lower pixel, on the other hand, only the wiring layer 29 is created.

The wiring layer 28 is connected to the wiring layer 23 shown in FIG. 6 to serve as a wiring layer connected to the right-side source/drain area of the select transistor SEL through the contact section 24. In this wiring layer 28, a contact section 30 for a connection to the upper wiring layer is created.

The wiring layer 29 is connected to the first ground wire 14 shown in FIG. 6 through the contact section 24. The wiring layer 29 is provided to serve as a shield layer for blocking light radiated from the adjacent pixels on the left and right sides to the photodiode 1.

As shown in FIGS. 3 and 4, in a portion between the upper and lower layers, the first control line 11, the second ground wire 15 and the second control line 12 are provided in parallel to each other.

In the transistor section 3, each of a select line 25 and a reset line 26 is created from the second wiring layer. In addition, a wiring layer 27 is created between the select line 25 and the reset line 26.

Through the contact section 24, the select line 25 is connected to the wiring layer 23 shown in FIG. 6 to serve as a wiring layer connected to the select gate electrode 8 and receives a pulse electric potential pSEL from an external source.

By the same token, through the contact section 24, the reset line 26 is connected to the wiring layer 23 shown in FIG. 6 to serve as a wiring layer connected to the reset gate electrode 6 and receives a pulse reset electric potential pRST from an external source.

On the other hand, through the contact section 24, the wiring layer 27 is connected to the wiring layer 23 shown in FIG. 6 to serve as a wiring layer connected to the source/drain area shared by the reset transistor RST and the amplify transistor AMP. In the wiring layer 27, a contact section 30 for a connection to the upper wiring layer is created.

Figure 8:
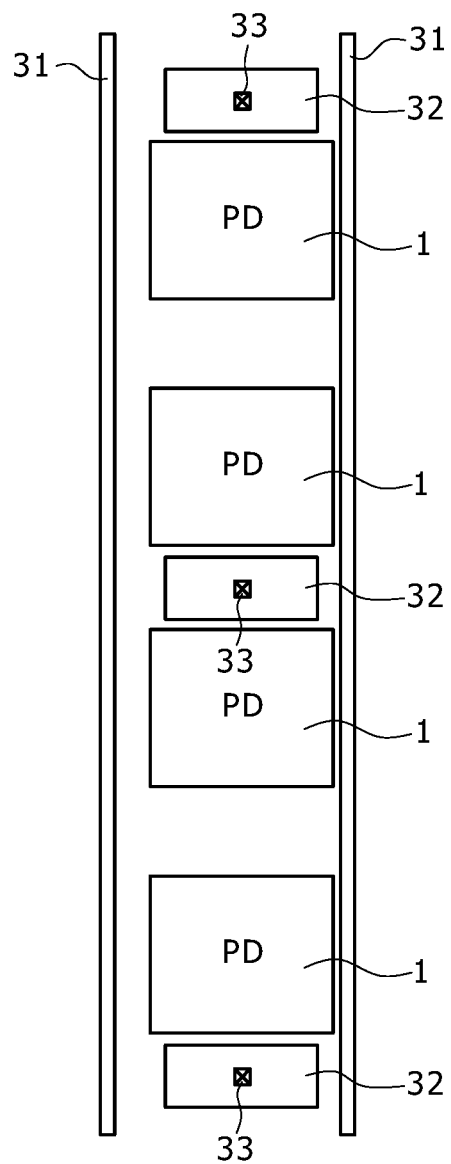
FIG. 8 is a diagram showing a top view of main components employed in the solid-state imaging apparatus according to the first embodiment.

FIG. 8 is a diagram showing a top view of a third wiring layer, which is a metallic wiring layer, and contact sections created on the layer. It is to be noted that FIG. 8 also shows the photodiodes 1 in order to make positional relations with other figures easy to understand.

On the left and right sides of the photodiode 1, vertical signal lines 31 are created and stretched in the vertical direction. The vertical signal line 31 is connected to the wiring layer 28 shown in FIG. 7 through a contact section 30.

In the transistor section 3, a wiring layer 32 is created as a planar pattern of a rectangle having a relatively large horizontal length. The wiring layer 32 is connected to the wiring layer 27 shown in FIG. 7 through the contact section 30. The wiring layer 32 is provided also to serve as a shield layer for blocking light radiated from the adjacent pixels on the upper and lower sides to the photodiode 1. In the wiring layer 32, a contact section 33 for a connection to the upper wiring layer is created.

Figure 9:
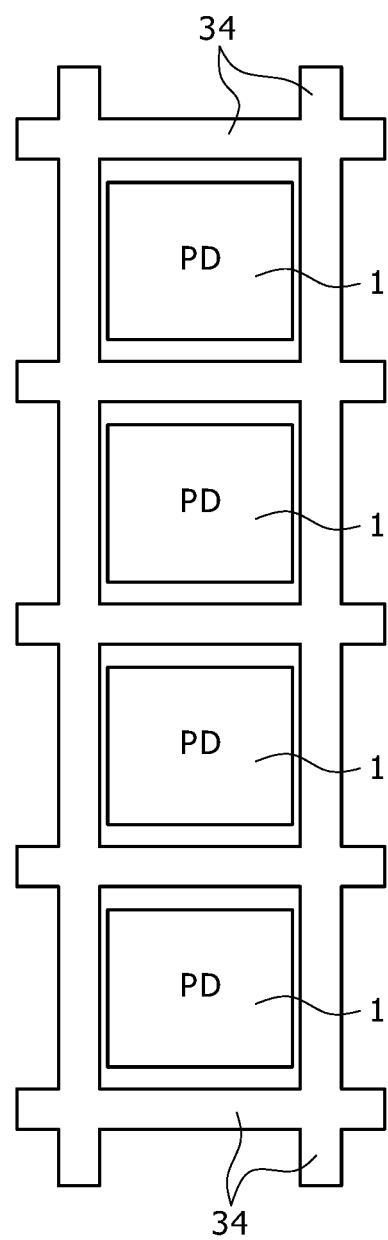
FIG. 9 is a diagram showing a top view of main components employed in the solid-state imaging apparatus according to the first embodiment.

FIG. 9 is a diagram showing a top view of a fourth wiring layer, which is a metallic wiring layer. It is to be noted that FIG. 9 also shows the photodiodes 1 in order to make positional relations with other figures easy to understand.

As shown in FIG. 9, a power-supply line 34 is created from a fourth wiring layer to form a mesh shape in such a way that the power-supply line 34 surrounds the photodiodes 1 on the upper, lower, left and right sides. The power-supply line 34 is connected to the wiring layer 32 shown in FIG. 8 through a contact section 33.

This power-supply line 34 receives a power-supply electric potential VDD from an external source.

By creating the power-supply line 34 to form a mesh shape, it is possible to block light coming from adjacent pixels on the upper, lower, left and right sides to the photodiodes 1.

It is to be noted that the top-view diagrams of FIGS. 5 to 9 are top-view diagrams for the so-called front-surface radiation structure of the solid-state imaging apparatus according to this embodiment. In the front-surface radiation structure, a surface on which circuit elements such as the transistors of the semiconductor base 10 are formed is provided on the same side as the incidence surface of light propagating to the photodiodes 1 of the semiconductor base 10.

In the so-called rear-surface radiation structure of a solid-state imaging apparatus, on the other hand, the surface on which circuit elements such as the transistors of the semiconductor base 10 are formed is provided on a side opposite to the incidence surface of light propagating to the photodiodes 1 of the semiconductor base 10. In the rear-surface radiation structure, incidence of light is not prevented even if a wire exists above the photodiodes 1.

In addition, it is also possible to provide a configuration in which the wiring layer 32 shown in FIG. 8 and the power-supply line 34 shown in FIG. 9 are eliminated whereas a power-supply line is created from a third wiring layer, provided above the photodiodes 1 and stretched vertically in parallel to the vertical signal line 31.

In the case of the rear-surface radiation structure in such a configuration, a wiring layer at the same level as the second metallic wiring layer or above the second metallic wiring layer can be provided arbitrarily as long as the wiring layer does not intersect other layers.

The solid-state imaging apparatus according to this embodiment can be manufactured by adoption of a commonly known manufacturing method.

It is possible to create the first ground wire 14, the second ground wire 15 and the contact section 16 for connecting the first ground wire 14 to the second ground wire 15 by adoption of a commonly known method for creating a metallic wiring layer and a via layer.

In accordance with the solid-state imaging apparatus implemented by this embodiment, for the first ground wire 14 created and stretched in the vertical direction, the second ground wire 15 created and stretched in the horizontal direction is provided and the first ground wire 14 and the second ground wire 15 are electrically connected to each other by making use of the contact section 16.

Thus, even if either the first ground wire 14 or the second ground wire 15 is broken, it is possible to provide an electric potential to the semiconductor base 10 through the other one of the first ground wire 14 and the second ground wire 15.

As a result, the electric potential of the semiconductor base 10 can be sustained at a fixed ground level so that it is possible to improve the image quality and increase the yield.

In addition, since the first ground wire 14 and the second ground wire 15 which are created on two layers are electrically connected to each other, the resistance of the first ground wire 14 and the second ground wire 15 can be reduced. It is thus possible to strengthen the ground electric potential of the semiconductor base 10. Therefore, it is possible to eliminate characteristic variations from pixel to pixel on the screen and get rid of shadings of the screen so as to improve the image quality and increase the yield.

In addition, in accordance with the solid-state imaging apparatus implemented by this embodiment, the second ground wire 15 is created from a first wiring layer which is a metallic wiring layer. This first wiring layer is the same layer as the first control line 11 and the second control line 12. In addition, the second ground wire 15 is provided between the first control line 11 and the second control line 12.

Thus, the second ground wire 15 receiving the ground electric potential serving as a fixed electric potential shields the first control line 11 and the second control line 12 which receive their respective pulse electric potentials. As a result, it is possible to prevent coupling between the first control line 11 and the second control line 12.

Accordingly, it is possible to prevent the waveforms of voltage pulses appearing on the first control line 11 and the second control line 12 from being deteriorated by the coupling. As a result, it is possible to reduce the width of the voltage pulses, carry out high-speed driving and increase the frame rate.

In addition, in accordance with the solid-state imaging apparatus implemented by this embodiment, two adjacent pixels share a floating diffusion 2 and a transistor section 3. Thus, in comparison with a no-sharing configuration, the number of wires connected to the transistor sections 3 can be made small.

For the reason described above, even if the second ground wire 15 is provided between the first control line 11 and the second control line 12, the total number of wires stretched in the horizontal direction can be made small in comparison with a configuration in which the floating diffusion 2 and the transistor section 3 are not shared by pixels.

In particular, in the case of the front-surface radiation structure, the total number of wires stretched in the horizontal direction can be made small in comparison with a configuration in which the floating diffusion 2 and the transistor section 3 are not shared by pixels. Thus, with few wires stretched in the horizontal direction, it is possible to allocate at least an equivalent area required by such a configuration to an opening on the photodiode 1. As a result, without reducing the sensitivity, it is possible to sustain the ground electric potential of the semiconductor base 10 and prevent the coupling between the first control line 11 and the second control line 12.

2. Second Embodiment

Figure 10:
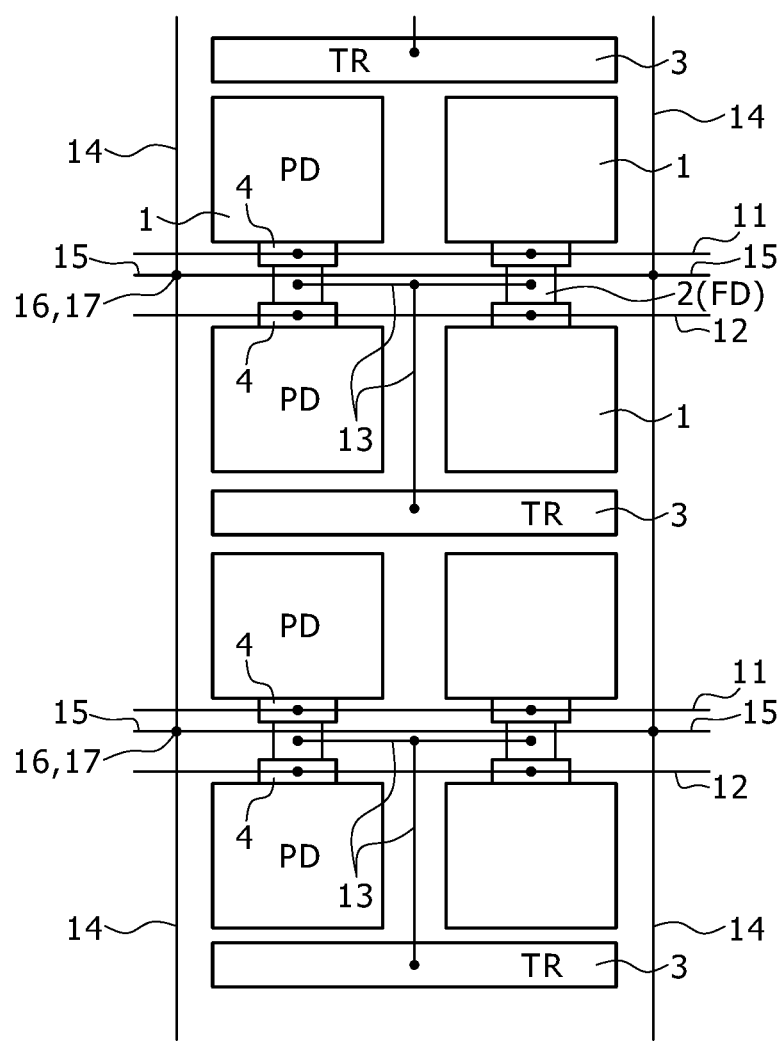
FIG. 10 is a diagram showing a rough configuration of a solid-state imaging apparatus according to a second embodiment or a diagram showing a circuit configuration of main components employed in the solid-state imaging apparatus.

FIG. 10 is a diagram showing a rough configuration of a solid-state imaging apparatus according to a second embodiment or a diagram showing a circuit configuration of main components employed in the solid-state imaging apparatus.

FIG. 10 is a diagram showing a circuit configuration of two vertical columns of pixels in the pixel section of the solid-state imaging apparatus.

This embodiment applies the present technology to a CMOS solid-state imaging apparatus.

In the solid-state imaging apparatus according to this embodiment, a floating diffusion 2 is shared by two pixels vertically adjacent to each other whereas a transistor section 3 is shared by two floating diffusions 2 horizontally adjacent to each other. That is to say, the pixel section is designed into a configuration in which a transistor section 3 is shared by four pixels laid out to form a matrix having two rows and two columns.

In this embodiment, the contact sections 16 each used for connecting the first ground wire 14 and the second ground wire 15 to each other are created on the left and right outer sides of the photodiodes 1 of pixels on the two columns sharing the transistor sections 3.

The number of created transistor sections 3 is adjusted to such a value that each of the transistor sections 3 is shared by two adjacent pixels provided on a column. The transistor section 3 is created to have a horizontally long shape in comparison with the first embodiment shown in FIG. 1.

The wire 13 used for connecting the floating diffusion 2 and the transistor section 3 to each other also connects two floating diffusions 2, which are adjacent to each other in the horizontal direction, to each other. The wire 13 is extended to the transistor section 3 through a gap between the two photodiodes 1 adjacent to each other in the horizontal direction.

Since the other configurations are identical with those of the first embodiment shown in FIG. 1, the other configurations are not explained again in the following description in order to avoid duplications of explanations.

In accordance with the configuration of the solid-state imaging apparatus implemented by this embodiment, in the same way as the first embodiment, the first ground wire 14 created and stretched in the vertical direction is electrically connected by the contact section 16 to the second ground wire 15 created and stretched in the horizontal direction.

Thus, even if either the first ground wire 14 or the second ground wire 15 is broken, it is possible to provide a ground electric potential to the semiconductor base 10 through the other one of the first ground wire 14 and the second ground wire 15.

As a result, the electric potential of the semiconductor base 10 can be sustained at a fixed ground level so that it is possible to improve the image quality and increase the yield.

In addition, since the first ground wire 14 and the second ground wire 15 are electrically connected to each other, the resistance of the first ground wire 14 and the second ground wire 15 can be reduced. It is thus possible to strengthen the ground electric potential of the semiconductor base 10. Therefore, it is possible to eliminate characteristic variations from pixel to pixel on the screen and get rid of shadings of the screen so as to improve the image quality and increase the yield.

In addition, in accordance with the configuration of this embodiment, the second ground wire 15 is provided between the first control line 11 and the second control line 12 in the same way as the first embodiment.

Thus, the second ground wire 15 receiving the ground electric potential serving as a fixed electric potential shields the first control line 11 and the second control line 12 which receive their respective pulse electric potentials. As a result, it is possible to prevent coupling between the first control line 11 and the second control line 12.

Accordingly, it is possible to prevent the waveforms of voltage pulses appearing on the first control line 11 and the second control line 12 from being deteriorated by the coupling. As a result, it is possible to reduce the width of the voltage pulses, carry out high-speed driving and increase the frame rate.

In addition, in accordance with the solid-state imaging apparatus implemented by this embodiment, four adjacent pixels share a transistor section 3. Thus, in comparison with a no-sharing configuration, the number of wires connected to the transistor sections 3 can be made small.

For the reason described above, even if the second ground wire 15 is provided between the first control line 11 and the second control line 12, the total number of wires stretched in the horizontal direction can be made small in comparison with a configuration in which the transistor section 3 is not shared by pixels.

In particular, in the case of the front-surface radiation structure, the total number of wires stretched in the horizontal direction can be made small in comparison with a configuration in which the transistor section 3 is not shared by pixels. Thus, with few wires stretched in the horizontal direction, it is possible to allocate at least an equivalent area required by such a configuration to an opening on the photodiode 1. As a result, without reducing the sensitivity, it is possible to sustain the ground electric potential of the semiconductor base 10 and prevent the coupling between the first control line 11 and the second control line 12.

3. Third Embodiment

Figure 11:
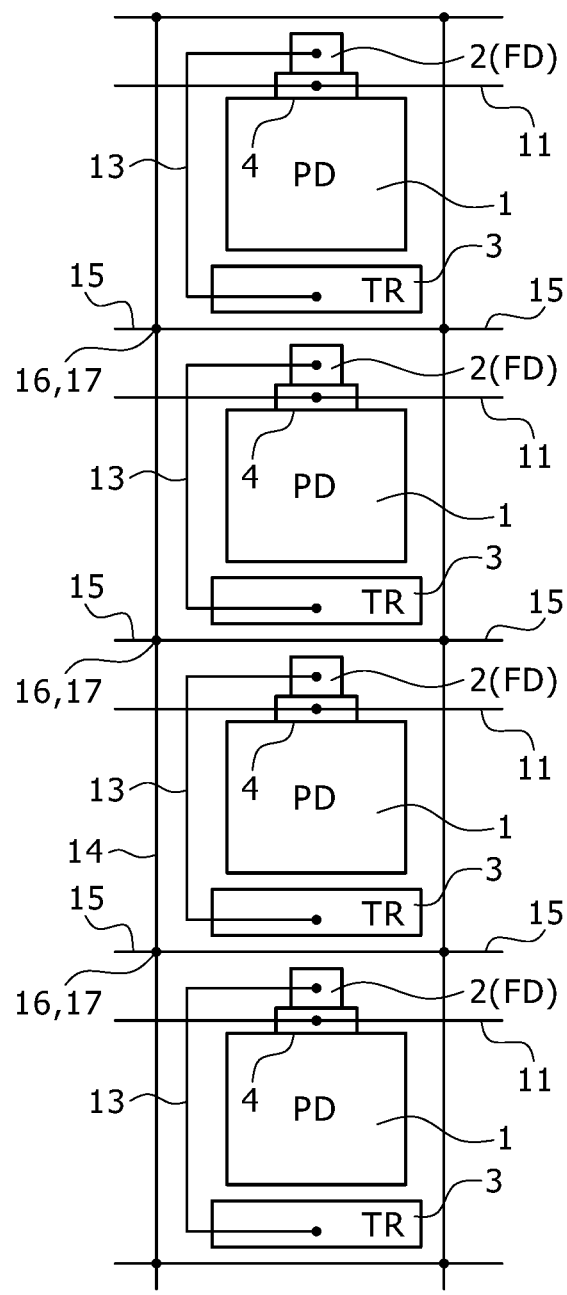
FIG. 11 is a diagram showing a rough configuration of a solid-state imaging apparatus according to a third embodiment or a diagram showing a circuit configuration of main components employed in the solid-state imaging apparatus.

FIG. 11 is a diagram showing a rough configuration of a solid-state imaging apparatus according to a third embodiment or a diagram showing a circuit configuration of main components employed in the solid-state imaging apparatus.

FIG. 11 is a diagram showing a circuit configuration of one vertical column of pixels in the pixel section of the solid-state imaging apparatus.

This embodiment applies the present technology to a CMOS solid-state imaging apparatus.

In the solid-state imaging apparatus according to the third embodiment, the floating diffusion 2 and the transistor section 3 are not shared by a plurality of pixels. Instead, each pixel is configured to include a floating diffusion 2 and a transistor section 3.

Thus, a control line connected to the transfer gate 4 is the first control line 11 only. This first control line 11 and the transfer gate 4 are provided on the upper side of the photodiode 1 as shown in the figure.

In the same way as the configurations shown FIGS. 1 and 13, the wire 13 for connecting the floating diffusion 2 and the transistor section 3 to each other is stretched through the left side of the photodiode 1.

The second ground wire 15 is stretched in the horizontal direction through a position between the transistor section 3 included in a pixel provided on the upper side and the floating diffusion 2 included in a pixel provided on the lower side. The second ground wire 15 is created as a wire parallel to the first control line 11.

In this embodiment, the first control lines 11 are provided at locations separated away from each other. Thus, there is no effect exhibited by the second ground wire 15 to prevent coupling between the two control lines.

However, the second ground wire 15 is provided between the first control line 11 and wires connected to the transistor section 3 to serve as a select line and a reset line. Thus, there is an effect of preventing coupling between the first control line 11 and the wires.

Since the other configurations are identical with those of the first embodiment shown in FIG. 1, the other configurations are not explained again in the following description in order to avoid duplications of explanations.

In accordance with the configuration of the solid-state imaging apparatus implemented by this embodiment described above, in the same way as the first embodiment, the first ground wire 14 created and stretched in the vertical direction is electrically connected by the contact section 16 to the second ground wire 15 created and stretched in the horizontal direction.

Thus, even if either the first ground wire 14 or the second ground wire 15 is broken, it is possible to provide an electric potential to the semiconductor base 10 through the other one of the first ground wire 14 and the second ground wire 15.

As a result, the electric potential of the semiconductor base 10 can be sustained at a fixed ground level so that it is possible to improve the image quality and increase the yield.

In addition, since the first ground wire 14 and the second ground wire 15 are electrically connected to each other, the resistance of the first ground wire 14 and the second ground wire 15 can be reduced. It is thus possible to strengthen the ground electric potential of the semiconductor base 10. Therefore, it is possible to eliminate characteristic variations from pixel to pixel on the screen and get rid of shadings of the screen so as to improve the image quality and increase the yield.

The solid-state imaging apparatus according to this embodiment can be applied to the front-surface radiation structure or the rear-surface radiation structure.

In the embodiments described above, the contact section 17 for connecting the semiconductor base 10 and the first ground wire 14 to each other is created at the same planar position as the contact section 16 for connecting the first ground wire 14 and the second ground wire 15 to each other.

However, implementations of the present technology are by no means limited to the configuration in which the contact section 17 is created at the same planar position as the contact section 16. For example, the contact section 16 and the contact section 17 can be created at positions separated away from each other in the vertical direction of FIG. 1.

Each of the embodiments described above has a configuration in which the ground wires are the first ground wire 14 configured from a first wiring layer and stretched in the vertical direction and the second ground wire 15 configured from a second wiring layer and stretched in the horizontal direction.

In accordance with the present technology, however, the ground wires of the two layers can have another configuration. For example, the ground wires are a ground wire configured from a first wiring layer and stretched in the horizontal direction and another ground wire configured from a second wiring layer and stretched in the vertical direction.

Each of the embodiments described above has a configuration in which the first ground wire 14 and the second ground wire 15 are electrically connected to the semiconductor base 10 to provide the semiconductor base 10 with a ground electric potential also referred to as an earth electric potential.

In accordance with the present technology, however, the first and second ground wires electrically connected to the semiconductor base are by no means limited to the configuration for providing the semiconductor base with a ground electric potential. For example, the first and second ground wires electrically connected to the semiconductor base can also has a configuration for providing the semiconductor base with another electric potential.

In addition, each of the embodiments described above has a configuration in which pixels are laid out in the vertical and horizontal directions whereas the ground wires of two layers are stretched in the vertical and horizontal directions respectively.

In accordance with the present technology, however, it is also possible to provide a configuration in which pixels are laid out in inclined directions whereas the ground wires of two layers are stretched in first and second directions respectively. In this case, the first and second directions are inclined directions intersecting each other.

In addition, in accordance with the present technology, the pixel is by no means limited to a rectangular (or quadrangular) shape. That is to say, the pixel can also be configured to have another shape such as a hexagonal shape.

In addition, a wire does not have to be straight. For example, it is also possible to provide a configuration in which hexagonal pixels are provided at locations different from each other whereas a zigzag wire is provided along the pixels and, as a whole, is stretched in one direction.

The solid-state imaging apparatus according to the present technology can be applied to a variety of electronic devices such as a camera system, a mobile phone having an imaging function and another device having an imaging function. Typical examples of the camera system are a digital camera and a video camera.

4. Fourth Embodiment

Electronic Device

Figure 12:
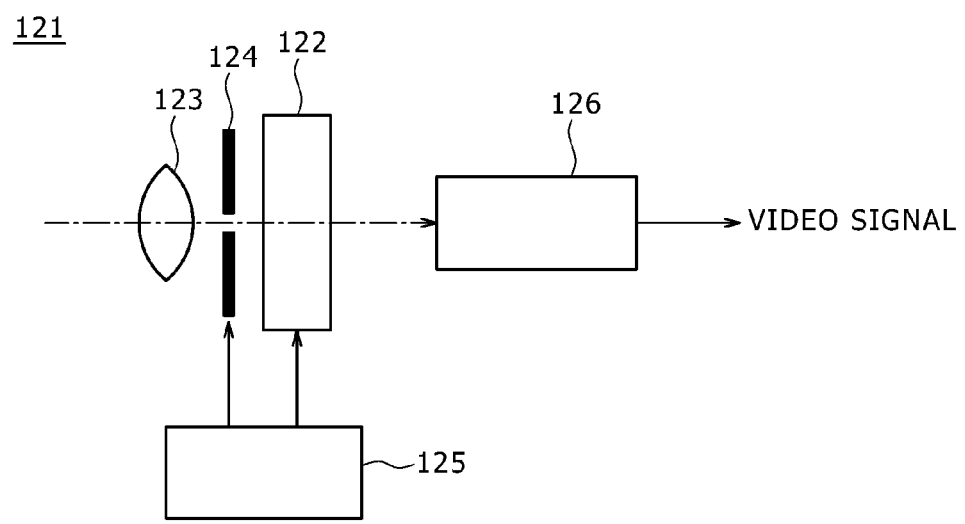
FIG. 12 is a block diagram showing a rough configuration of an electronic device according to a fourth embodiment.

FIG. 12 is a block diagram showing a rough configuration of an electronic device 121 according to a fourth embodiment.

This embodiment applies the present technology to an electronic device 121 having a camera capable of taking a still image and/or a moving image.

As shown in FIG. 12, the electronic device 121 includes a solid-state imaging apparatus 122, an optical system 123, a shutter apparatus 124, a driving circuit 125 and a signal processing circuit 126.

The optical system 123 is configured to include an optical lens. The optical system 123 creates an image on the pixel section of the solid-state imaging apparatus 122 on the basis of incident light which is image light coming from an object of imaging. Thus, signal electric charge is accumulated in the solid-state imaging apparatus 122 for a fixed period of time. The optical system 123 can be an optical-lens system including a plurality of optical lenses.

The solid-state imaging apparatus 122 is a solid-state imaging apparatus provided by the present technology. As described before, the solid-state imaging apparatus provided by the present technology is a solid-state imaging apparatus according to any one of the embodiments explained earlier.

The shutter apparatus 124 controls the period of radiation of light to the solid-state imaging apparatus 122 and the period of light blocking.

The driving circuit 125 provides the solid-state imaging apparatus 122 with a driving signal for controlling signal transfer operations carried out by the solid-state imaging apparatus 122. In addition, the driving circuit 125 also provides the shutter apparatus 124 with a driving signal for controlling shutter operations carried out by the shutter apparatus 124. A signal is transferred from the solid-state imaging apparatus 122 to the signal processing circuit 126 in accordance with the driving signal supplied by the driving circuit 125 to the solid-state imaging apparatus 122 to serve as a timing signal.

The signal processing circuit 126 carries out various kinds of signal processing. A video signal obtained as a result of the execution of the signal processing is stored in a recording medium such as a memory or output to a monitor.

In accordance with the configuration of the electronic device 121 implemented by this embodiment as described above, the solid-state imaging apparatus 122 is a solid-state imaging apparatus provided by the present technology. As described before, the solid-state imaging apparatus provided by the present technology is a solid-state imaging apparatus according to any one of the embodiments explained earlier. It is thus possible to improve the quality of an image generated by the solid-state imaging apparatus 122 and increase the yield of the solid-state imaging apparatus 122.

The configuration of an electronic device provided by the present technology is by no means limited to that shown in FIG. 12. That is to say, the electronic device provided by the present technology can have a configuration other than that shown in FIG. 12 as long as the configuration includes a solid-state imaging apparatus provided by the present technology.

It is to be noted that the present technology can also be realized into the following implementations:

(1) A solid-state imaging apparatus including:
a semiconductor base;
a photodiode created on the semiconductor base and used for carrying out photoelectric conversion;
a pixel section provided with pixels each having the photodiode;
a first wire created by being electrically connected to the semiconductor base for the pixel section through a contact section and being extended in a first direction to the outside of the pixel section;
a second wire made from a wiring layer different from the first wire and created by being extended in a second direction different from the first direction to the outside of the pixel section; and
a contact section for electrically connecting the first and second wires to each other.

(2) The solid-state imaging apparatus according to implementation (1) wherein a plurality of the pixels share an electric-charge accumulating section and a transistor section.

(3) The solid-state imaging apparatus according to implementation (2), the solid-state imaging apparatus further including:
a transfer gate provided between the electric-charge accumulating section and the photodiode; and
a control line electrically connected to the transfer gate,
wherein the second wire is provided between any adjacent ones of a plurality of the control lines each electrically connected to the transfer gate of one of the pixels at an altitude equal to that of the control lines.

(4) The solid-state imaging apparatus according to any one of implementations (1) to (3) wherein a source external to the pixels supplies an earth electric potential to the first and second wires.

(5) An electronic device including an optical system, the solid-state imaging apparatus according to any one of implementations (1) to (4) and a signal processing circuit for processing signals output by the solid-state imaging apparatus.

Implementations of the present technology are by no means limited to the embodiments described earlier. That is to say, it is possible to provide a variety of configurations in a range not deviating from essentials of the present technology.

What is claimed is:

1. An imaging apparatus comprising:
a semiconductor substrate;
a first photodiode;
a second photodiode;
an amplify transistor;
a reset transistor;
a select transistor;
a first wire formed in a first wiring layer and electrically connected to the semiconductor substrate through a first contact section;
a second wire formed in a second wiring layer and electrically connected to the first wire through a second contact section;
a third wire formed in a third wiring layer and electrically connected to the select transistor through a third contact section; and
a fourth wire formed in a fourth wiring layer and electrically connected to the amplify transistor through a fourth contact section,
wherein the first photodiode and the second photodiode are arranged in a first direction and share the amplify transistor,
wherein the first wire extends along the first direction, and wherein the second wire extends along a second direction different from the first direction.

2. The imaging apparatus according to claim 1, wherein the third wire extends along the first direction.

3. The imaging apparatus according to claim 1, wherein the fourth wire has a mesh shape.

4. The imaging apparatus according to claim 1, wherein the first photodiode and the second photodiode share the amplify transistor and the reset transistor.

5. The imaging apparatus according to claim 1, wherein the first photodiode and the second photodiode share the amplify transistor, the reset transistor, and the select transistor.

6. The imaging apparatus according to claim 1,
wherein the second wiring layer is formed on the first wiring layer,
wherein the third wiring layer is formed on the second wiring layer, and
wherein the fourth wiring layer is formed on the third wiring layer.

7. The imaging apparatus according to claim 1,
wherein the first wire extends to outside of the first photodiode and the second photodiode, and
wherein the second wire extends to outside of the first photodiode and the second photodiode.

8. The imaging apparatus according to claim 1, wherein the third wire is electrically connected to the select transistor through a wire formed in the second wiring layer.

9. The imaging apparatus according to claim 1, wherein the fourth wire is electrically connected to the amplify transistor and the reset transistor.

10. The imaging apparatus according to claim 1, wherein the fourth wire is electrically connected to the amplify transistor through a wire formed in the third wiring layer and a wire formed in the second wiring layer.

11. The imaging apparatus according to claim 1, further comprising a reset line connected to a gate of the reset transistor, wherein the reset line is formed in the second wiring layer.

12. The imaging apparatus according to claim 1, further comprising a select line connected to a gate of the select transistor, wherein the select line is formed in the second wiring layer.

13. The imaging apparatus according to claim 1, further comprising:
a first transfer transistor connected to the first photodiode;
a second transfer transistor connected to the second photodiode;
a first control line connected to a gate of the first transfer transistor; and
a second control line connected to a gate of the second transfer transistor.

14. The imaging apparatus according to claim 13, wherein the first control line and the second control line are formed in the second wiring layer.

15. The imaging apparatus according to claim 13, further comprising a wire connected to the first transfer transistor and the second transfer transistor, wherein the wire formed in the first wiring layer and has a "[" shape.

16. The imaging apparatus according to claim 1,
wherein the second wiring layer is formed on the first wiring layer,
wherein the third wiring layer is formed on the second wiring layer,
wherein the fourth wiring layer is formed on the third wiring layer,
wherein the third wire is electrically connected to the select transistor through a first interconnection formed in the second wiring layer, and
wherein the fourth wire is electrically connected to the amplify transistor through a second interconnection formed in the third wiring layer and a third interconnection formed in the second wiring layer.

17. The imaging apparatus according to claim 16, further comprising:
a reset line connected to a gate of the reset transistor; and
a select line connected to a gate of the select transistor,
wherein the reset line is formed in the second wiring layer, and
wherein the select line is formed in the second wiring layer.

18. The imaging apparatus according to claim 17, further comprising:
a first transfer transistor connected to the first photodiode;
a second transfer transistor connected to the second photodiode;
a first control line connected to a gate of the first transfer transistor; and
a second control line connected to a gate of the second transfer transistor.

19. The imaging apparatus according to claim 18, wherein the fourth wire has a mesh shape.

20. The imaging apparatus according to claim 19, wherein the first photodiode and the second photodiode share the amplify transistor and the reset transistor.

* * * * *